(12) United States Patent
Bae et al.

(10) Patent No.: US 8,188,768 B2
(45) Date of Patent: May 29, 2012

(54) LOW POWER CONSUMPTION LOW KICK-BACK NOISE COMPARATOR CIRCUIT FOR ANALOG-TO-DIGITAL CONVERTER

(75) Inventors: Jun Hyun Bae, Pohang-si (KR); Hong June Park, Pohang-si (KR)

(73) Assignee: Postech Academy-Industry Foundation, Pohang-si (KR)

( * ) Notice: Subject to any disclaimer, the term of this patent is extended or adjusted under 35 U.S.C. 154(b) by 214 days.

(21) Appl. No.: 12/773,537

(22) Filed: May 4, 2010

(65) Prior Publication Data

US 2010/0283511 A1    Nov. 11, 2010

(30) Foreign Application Priority Data

May 7, 2009   (KR) .................. 10-2009-0039551

(51) Int. Cl.
*H03K 5/22*    (2006.01)
(52) U.S. Cl. .................. 327/66; 327/53; 327/55; 327/57

(58) Field of Classification Search .................. 327/52, 327/53, 55, 57, 65, 66, 89
See application file for complete search history.

(56) References Cited

U.S. PATENT DOCUMENTS

| | | | |
|---|---|---|---|
| 7,635,994 B1 * | 12/2009 | Wadhwa | 327/63 |
| 7,675,330 B2 * | 3/2010 | Chen et al. | 327/108 |
| 7,944,252 B1 * | 5/2011 | Bhakta et al. | 327/108 |

* cited by examiner

*Primary Examiner* — Hai L Nguyen
(74) *Attorney, Agent, or Firm* — Kile Park Goekjian Reed & McManus PLLC

(57) ABSTRACT

The present invention is directed for a comparator circuit used in an analog-to-digital converter, and more particularly, for a low power consumption low kick-back noise comparator circuit for an analog-to-digital converter, which can significantly reduce kick-back noise generated in a signal input stage due to a signal regeneration method employed in a signal comparing operation and can efficiently reduce power consumption.

19 Claims, 5 Drawing Sheets

LOW POWER CONSUMPTION LOW KICK-BACK NOISE COMPARATOR CIRCUIT FOR ANALOG-TO-DIGITAL CONVERTER

BACKGROUND OF THE INVENTION

1. Field of the Invention

The present invention relates to a comparator circuit used in an analog-to-digital converter, and more particularly, to a low power consumption low kick-back noise comparator circuit for an analog-to-digital converter, which can significantly reduce kick-back noise generated in a signal input stage due to a signal regeneration method employed in a signal comparing operation and can efficiently reduce power consumption.

2. Description of the Related Art

In general, an analog-to-digital converter stands for an electronic circuit which converts an analog signal represented as an electrically continuous voltage with the lapse of time into an electrically discrete digital signal and outputs the converted digital signal.

FIG. 1 is a block diagram illustrating the configuration of a conventional analog-to-digital converter.

Referring to FIG. 1, an analog-to-digital converter includes a reference voltage generator 10, a pre-amplification stage 20, a comparator circuit 30, and a digital encoding unit and 50. The analog-to-digital converter receives an externally applied input analog signal A_IN and reference voltages REFT and REFB as input signals and outputs converted digital outputs B-OUT[N-1:0] as output signals.

The reference voltage generator 10 is composed of a resistor string which divides the reference voltages REFT and REFB into fine voltages through a number of steps. The reference voltages REFT and REFB are respectively applied to both ends of the resistor string.

The pre-amplification stage 20 is composed of amplifiers having one input terminals to which the externally applied input analog signal A_IN to be converted is applied and the other input terminals to which the reference voltages generated in the reference voltage generator 10 are applied. The pre-amplification stage 20 is configured to compare the reference voltages and the input analog signal A_IN and amplify the signals.

The comparator circuit 30 is connected to the output terminals of the pre-amplification stage 20, and is configured to compare the polarities of the output signals from the pre-amplification stage 20 and convert the analog signals outputted from the pre-amplification stage 20 into digital signals.

The digital encoding unit is composed of a latch section 40 and an encoder 50 which convert the output signals of the comparator circuit 30 into finally changed digital outputs and output optional N-bit (N is a natural number greater than 1) digital signals.

In the analog-to-digital converter, the comparator circuit 30 is regarded as an essential circuit component for converting analog signals into digital signals. Depending upon the performance of the comparator circuit 30, various performance indexes of the entire analog-to-digital converter, including resolution, speed, power consumption, etc. are determined.

FIG. 2 is a configurational view of the comparator circuit which employs a conventional signal regeneration method.

Referring to FIG. 2, the comparator circuit includes an input stage 60 and a signal regeneration stage 70. The digital signals converted in the signal regeneration stage 70 are outputted as an output signal OUT to the digital encoding unit 40 and 50 through a latch 80.

The input stage 60 includes two transfer transistors MNI0 and MNI1 having gate terminals to which input signals INP and INN amplified and outputted by the pre-amplification stage 20 are applied, one terminals which are directly connected to signal regeneration nodes a and b provided in the signal regeneration stage 70 and the other terminals which are commonly connected with each other, and a bias transistor having a gate terminal to which a bias voltage BIAS is applied, one terminal which is connected to the commonly connected terminals of the two transfer transistors MNI0 and MNI1 and the other terminal which is connected to a ground source.

In the signal regeneration stage 70, the signal regeneration nodes a and b for receiving the input signals INP and INN from the respective one terminals of the two transfer transistors MNI0 and MNI1 provided in the input stage 60 are directly connected to the input stage 60. The signal regeneration stage 70 includes two PMOS transistors MP0 and MP1 having one terminals which are respective connected to the signal regeneration nodes a and b, and two NMOS transistors MN0 and MN1 having one terminals which are respectively connected to output nodes R and S for outputting a difference between the two input signals INP and INN, converted into a digital signal.

The two PMOS transistors MP0 and MP1 have the one terminals which are connected to the signal regeneration nodes a and b and gate terminals which are cross-connected to the one terminals of the two PMOS transistors MP0 and MP1, and the two NMOS transistors MN0 and MN1 have the one terminals which are connected to the output nodes R and S and gate terminals which are cross-connected to the one terminals of the two NMOS transistors MN0 and MN1, whereby cross-coupled inverters are constituted.

The signal regeneration stage 70 further includes a PMOS transistor having a gate terminal to which a clock signal CLK is applied and source and drain terminals which are respectively connected to the signal regeneration nodes a and b so as to be applied with the input signals INP and INN.

Also, the signal regeneration stage 70 includes two transistors having gate terminals to which a complementary clock signal CLKB having a logic value complementary to the clock signal CLK is applied, one terminals to which the signal regeneration nodes a and b are connected and the other terminals to which the output nodes R and S are connected, and an NMOS transistor having a gate terminal to which the complementary clock signal CLKB is applied and source and drain terminals which are respectively connected to the output nodes R and S.

In the conventional signal regeneration method, in order to realize a quick signal comparing operation, a small difference between the input signals INP and INN is quickly converted into a digital signal by a positive feedback operation in the cross-coupled inverters which is performed for a time during which the complementary clock signal CLKB is in a logic low state.

However, when such a signal regeneration method is employed, although the quick operation speed of the comparator circuit can be achieved through quick signal sensing capability, a large amount of power is consumed to generate a high voltage level signal in the signal regeneration stage 70.

Also, in the comparator circuit using the conventional signal regeneration method, since the input stage 60 is directly connected to the signal regeneration nodes a and b, a large amount of current is introduced into the input stage 60 from the signal regeneration stage 70 during a signal regeneration process, whereby power consumption increases.

Moreover, in the case where the input stage 60 is directly connected to the signal regeneration nodes a and b of the signal regeneration stage 70 as described above, since the voltage changed to a high level in the signal regeneration nodes a and b is transferred to the input signals INP and INN of the comparator circuit by the parasitic capacitance present between the gates and the drains of the two transfer transistors MNI0 and MNI1 provided in the input stage 60, a problem is caused in that kick-back noise is induced so that the signals from the input stage 60 of the comparator circuit are likely to be distorted, whereby the performance of the analog-to-digital converter may deteriorate.

As a consequence, in the comparator circuit using the conventional signal regeneration method, although the quick signal comparing operation is possible, the application of the analog-to-digital converter adopting the comparator circuit using the conventional signal regeneration method cannot help but be limited to a circuit operating at a high speed, in which it is not necessary to consider power consumption, due to great power consumption and large kick-back noise.

Accordingly, in order to allow the analog-to-digital converter operating at a high speed to be widely used in various application fields, a comparator circuit having low power consumption and reduced kick-back noise is keenly demanded in the art.

SUMMARY OF THE INVENTION

Accordingly, the present invention has been made in an effort to solve the problems occurring in the related art, and an object of the present invention is to provide a low power consumption low kick-back noise comparator circuit for an analog-to-digital converter, which can reduce power consumption due to a signal regeneration method and minimize kick-back noise transferred from signal regeneration nodes to an input stage in a comparator circuit adopting the signal regeneration method employed in an analog-to-digital converter.

In order to achieve the above object, according to one aspect of the present invention, there is provided a comparator circuit for an analog-to-digital converter, comprising an input stage including a pair of differential input sections having input transistors to gate terminals of which differential input signals are applied and a bias transistor to a gate terminal of which a bias voltage is applied, and PMOS diode loads configured to indirectly transfer the differential input signals to a signal regeneration stage; the signal regeneration stage including PMOS current sources connected to the PMOS diode loads and configured to form current mirrors, a signal regeneration circuit having one terminals which are connected to the PMOS current sources and constituted by connecting inputs and outputs of two inverters with each other, and two NMOS switches having one terminals which are connected to the signal regeneration circuit and the other terminals which are connected to a ground source; and a sensing stage including an input section configured to receive output signals of first and second signal regeneration nodes as outputs of the signal regeneration stage, and first and second transmission gates configured to sense the signals applied to the input section, generate logic signals and transfer the generated logic signals to a latch.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
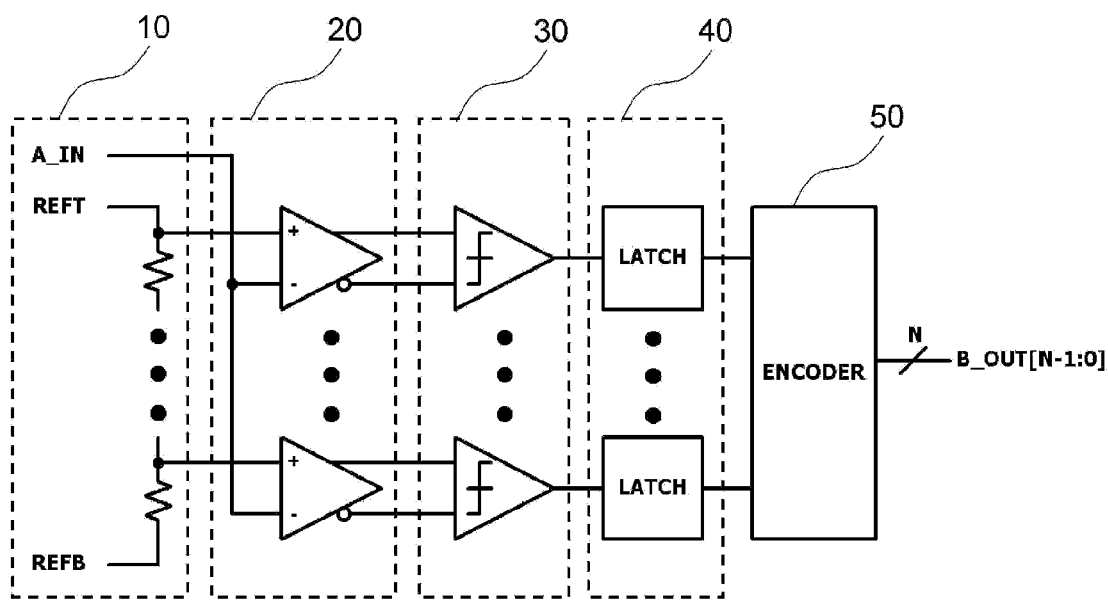
FIG. 1 is a block diagram illustrating the configuration of a conventional analog-to-digital converter.
Figure 2:
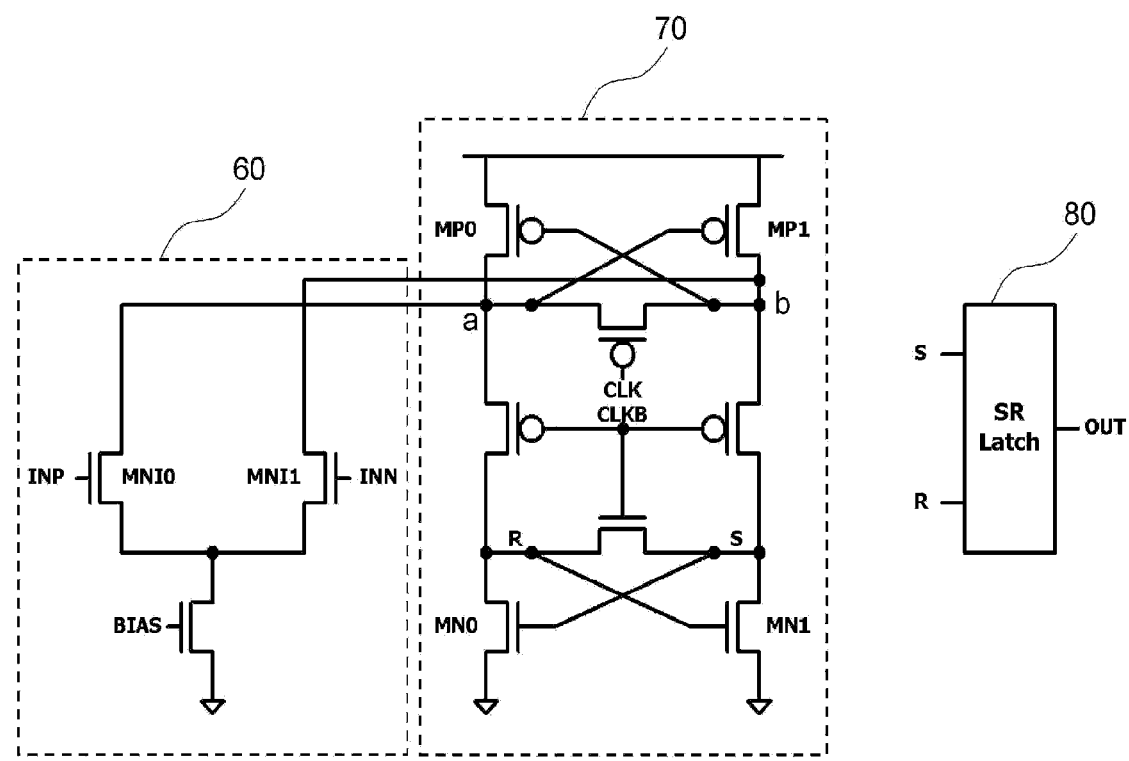
FIG. 2 is a configurational view of a comparator circuit which employs a conventional signal regeneration method.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
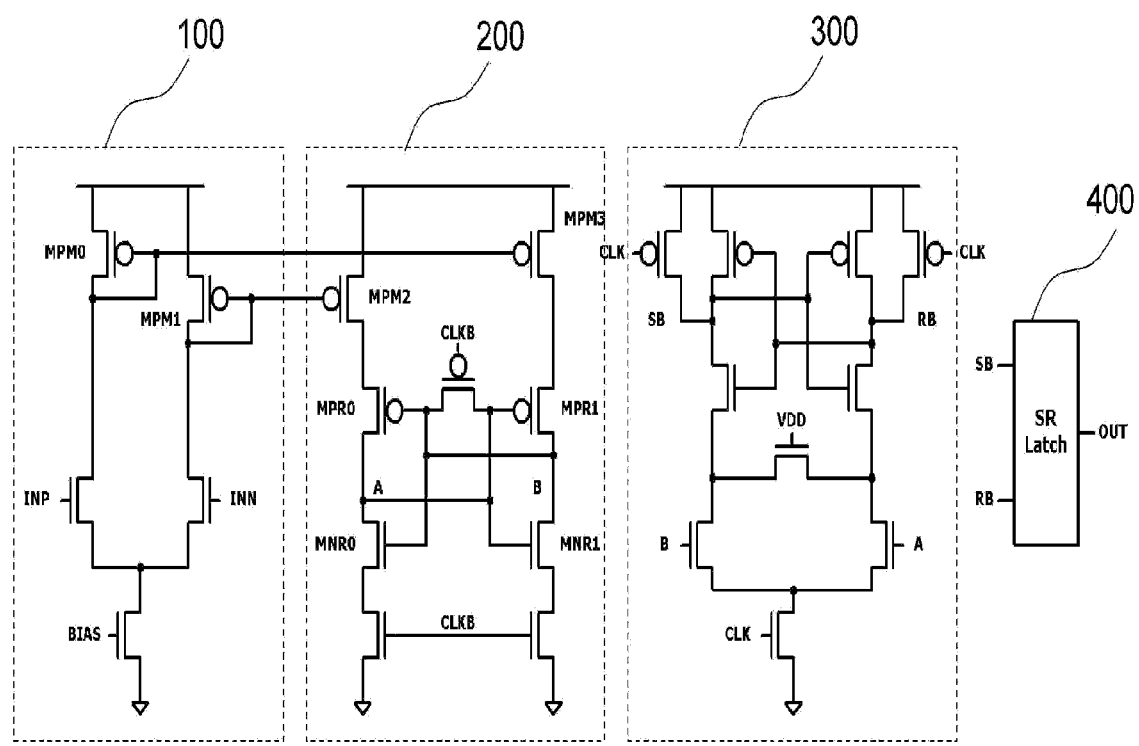
FIG. 3 is a configurational view of a low power consumption low kick-back noise comparator circuit for an analog-to-digital converter in accordance with an embodiment of the present invention.

FIG. 3 is a configurational view of a low power consumption low kick-back noise comparator circuit for an analog-to-digital converter in accordance with an embodiment of the present invention.

Referring to FIG. 3, a low power consumption low kick-back noise comparator circuit for an analog-to-digital converter in accordance with an embodiment of the present invention has a three-staged structure including an input stage 100, a signal regeneration stage 200, and a sensing stage 300. The comparator circuit further includes a latch 400 for outputting the value sensed by the sensing stage 300.

The input stage 100 is composed of a differential signal amplifier having a simple configuration, which includes a pair of differential input sections and PMOS diode loads.

The pair of differential input sections include input transistors, to which input signals INP and INN are applied, and a bias transistor. The PMOS diode loads are configured to constitute current mirrors with respect to PMOS current sources provided in the signal regeneration stage 200.

The input transistors are composed of first and second input transistors. The first and second input transistors have gate terminals to which the input signals INP and INN are respectively applied, one terminals which are respectively connected to one terminals of the PMOS diode loads constituting the current mirrors with respect to the signal regeneration stage 200, and the other terminals which are commonly connected with each other and are connected to one terminal of the bias transistor. The bias transistor has a gate terminal to which a bias voltage BIAS is applied, one terminal which is connected to the common terminals of the first and second input transistors, and the other terminal which is connected to a ground source.

The PMOS diode loads include first and second PMOS transistors MPM0 and MPM1. The first and second PMOS transistors MPM0 and MPM1 have one terminals which are connected to the gate terminals of the first and second PMOS transistors MPM0 and MPM1 and are connected to the one terminals of the first and second input transistors, the other terminals which are connected to a power supply source, and the gate terminals which are respectively connected to the gate terminals of PMOS current sources MPM3 and MPM2 of the signal regeneration stage 200 and constitute the current mirrors.

The signal regeneration stage 200 includes the PMOS current sources MPM3 and MPM2 which are connected to the PMOS diode loads and constitute current mirrors, a signal regeneration circuit which is connected to the PMOS current sources MPM3 and MPM2 at one terminals thereof and is constituted by connecting inputs and outputs of two inverters with each other, and two NMOS switches which have one terminals connected to the signal regeneration circuit and the other terminals connected to the ground source.

The PMOS current sources include a first PMOS current source MPM2 and a second PMOS current source MPM3. The first PMOS current source MPM2 has a gate terminal which is connected to the gate terminal of the second PMOS transistor MPM1 constituting the current mirror, one terminal which is connected to one terminal of a first regeneration transistor MPR0 constituting the signal regeneration circuit, and the other terminal which is connected to the power supply source. The second PMOS current source MPM3 has a gate terminal which is connected to the gate terminal of the first PMOS transistor MPM0 constituting the current mirror, one terminal which is connected to one terminal of a second regeneration transistor MPR1 constituting the signal regeneration circuit, and the other terminal which is connected to the power supply source.

In this way, due to the fact that the PMOS diode loads MPM0 and MPM1 of the input stage 100 and the PMOS current sources MPM2 and MPM3 are configured in such a way as to constitute the current mirrors, the input signal INP inputted to the first input transistor is transferred to the second PMOS current source MPM3 through the first PMOS transistor MPM0 and is applied to the signal regeneration circuit, and the input signal INN inputted to the second input transistor is transferred to the first PMOS current source MPM2 through the second PMOS transistor MPM1 and is applied to the signal regeneration circuit.

The signal regeneration circuit includes a regeneration control transistor, and regeneration transistors MPR0, MPR1, MNR0 and MNR1. The regeneration control transistor has a gate terminal to which a control signal CLKB for controlling a regenerating operation is applied and one and the other terminals which are connected to the regeneration transistors MPR0, MPR1, MNR0 and MNR1. The regeneration transistors MPR0, MPR1, MNR0 and MNR1 are configured to regenerate the input signals indirectly transferred from the input stage 100 by virtue of the current mirror structure.

The regeneration transistors include a first regeneration transistor MPR0 having one terminal which is connected to the one terminal of the first PMOS current source MPM2 and the other terminal which is connected to a first signal regeneration node A, a second regeneration transistor MPR1 having one terminal which is connected to the one terminal of the second PMOS current source MPM3 and the other terminal which is connected to a second signal regeneration node B, a third regeneration transistor MNR0 having one terminal which is connected to the first signal regeneration node A and the other terminal which is connected to a first NMOS switch, and a fourth regeneration transistor MNR1 having one terminal which is connected to the second signal regeneration node B and the other terminal which is connected to a second NMOS switch.

The one terminal of the regeneration control transistor is commonly connected to the gate terminals of the first and third regeneration transistors MPR0 and MNR0, and the other terminal of the regeneration control transistor is commonly connected to the gate terminals of the second and fourth regeneration transistors MPR1 and MNR1.

The gate terminal of the first regeneration transistor MPR0 is connected to the second signal regeneration node B on the one terminal of the second regeneration transistor MPR1, and the gate terminal of the second regeneration transistor MPR1 is connected to the first signal regeneration node A on the one terminal of the first regeneration transistor MPR0.

The NMOS switches includes the first NMOS switch and the second NMOS switch. The first NMOS switch has one terminal which is connected to the other terminal of the third regeneration transistor MNR0 and the other terminal which is connected to the ground source. The second NMOS switch has one terminal which is connected to the other terminal of the fourth regeneration transistor MNR1 and the other terminal which is connected to the ground source. Gate terminals of the first and second NMOS switches are connected with each other and are applied with the control signal CLKB to be controlled in the operations thereof.

The sensing stage 300 is composed of a sense amplifier which senses the values of the first and second signal regeneration nodes A and B as the outputs of the signal regeneration stage 200, generates logic signals SB and RB, and transfers the generated logic signals SB and RB to the latch 400.

The sense amplifier includes an input section which receives the output signals from the signal regeneration nodes A and B which are regenerated and transmitted by the signal regeneration stage 200, and a first transmission gate and a second transmission gate which sense the signals applied to the input section and generate the logic signals.

The input section has gate terminals to which the output values of the first and second signal regeneration nodes A and B are respectively inputted, one terminals which are connected to the first and second transmission gates through transistors, and the other terminals which are connected to the ground source through transistors controlled by the control signal CLKB.

The first transmission gate is composed of two transistors having gate terminals to which a control signal CLK is applied, one terminals which are connected with each other and the other terminals which are connected to the power supply source, and the output signal SB where the one terminals of the two transistors are connected with each other is transmitted to the latch 400. The second transmission gate is composed of two transistors having gate terminals to which the control signal CLK is applied, one terminals which are connected with each other and the other terminals which are connected to the power supply source, and the output signal RB where the one terminals of the two transistors are connected with each other is transmitted to the latch 400.

The latch 400 is configured to receive the output signals SB and RB of the sensing stage 300, convert the analog input signals INP and INN transferred to the signal regeneration stage 200 into digital signals depending upon sensing results, and output the digital signals as an output OUT.

The low power consumption low kick-back noise comparator circuit for an analog-to-digital converter in accordance with the embodiment of the present invention, configured as mentioned above, operates as described below.

First, the input stage 100 consumes current by the bias voltage BIAS supplied to the bias transistor at any time regardless of the clock signals CLK and CLKB as the control signals, amplifies the differential input signals INP and INN inputted to the first and second input transistors, and transfers the amplified differential input signals to the signal regeneration stage 200.

Since the input stage 100 and the signal regeneration stage 20 are connected through the current mirrors, the transfer of the differential input signals from the input stage 100 to the signal regeneration stage 200 is implemented not by a voltage but by a current.

The sensing stage 300 is controlled in its operation by the clock signal CLK as the control signal. The sensing stage 300 operates by consuming current only for a time during which the clock signal CLK is in a logic high (logic 1) state, and does not consume power for a time during which the clock signal CLK as the control signal is in a logic low (logic 0) state. Conversely, the signal regeneration stage 200 is controlled in its operation by the complementary clock signal CLKB complementary to the clock signal CLK. The signal regeneration stage 200 operates by consuming current only for a time during which the complementary clock signal CLKB is in a logic high (logic 1) state, and does not consume power for a time during which the complementary clock signal CLKB is in a logic low (logic 0) state.

Accordingly, since the first and second NMOS switches, which are applied with the complementary clock signal CLKB through the gate terminals thereof, are disconnected for the time during which the complementary clock signal CLKB is in the logic low state, power consumption at the signal regeneration stage 200 is 0. If the complementary control signal CLKB changes to the logic high state, since the first and second NMOS switches, which are applied with the complementary clock signal CLKB through the gate terminals thereof, are energized and connect the ground source and the signal regeneration circuit, the signal regeneration stage 200 consumes power and regenerates the differential input signals transferred from the input stage 100.

The differential input signals are transferred from the input stage 100 to the signal regeneration stage 200 through the current mirrors MPM0, MPM1, MPM2 and MPM3. That is to say, amounts of current supplied from the second and first PMOS current sources MPM3 and MPM2 to the signal regeneration circuit in the signal regeneration stage 200 are determined depending upon the currents which flow through the first and second PMOS transistors MPM0 and MPM1 by the differential input signals INP and INN inputted to the first input transistor and the second input transistor of the input stage 100. As a consequence, the signal regeneration circuit operates by the amounts of current supplied from the first and second PMOS current sources MPM2 and MPM3, to regenerate and amplify the signals transferred from the input stage 100 and output the regenerated and amplified signals. The signals regenerated by the signal regeneration circuit are respectively present on the signal regeneration nodes A and B of the signal regeneration stage 200.

As shown in FIG. 3, the first and second PMOS current sources MPM2 and MPM3 provided in the signal regeneration stage 200 are indirectly connected to the signal regeneration nodes A and B through the two PMOS transistors provided in the signal regeneration circuit, that is, the first and second regeneration transistors MPR0 and MPR1.

In this way, due to the fact that the signal regeneration stage 200 is indirectly connected to the input stage 100 through the first and second regeneration transistors MPR0 and MPR1, large voltages generated from the signal regeneration nodes A and B during a signal regeneration process are prevented from being transferred to connection nodes between the current mirrors and the signal regeneration circuit. Accordingly, it is possible to prevent the voltages regenerated by the signal regeneration nodes A and B from being transferred to the input stage 100 to induce kick-back noise.

Also, because the signal regeneration circuit composed of the two inverters consumes power only for a very short time until signal regeneration is completed after the complementary clock signal CLKB is in the logic high state, power consumption of the signal regeneration stage 200 can be significantly reduced.

The sensing stage 300 consumes power only for the time during which the clock signal CLK is in the logic high (logic 1) state, and senses the voltage signals regenerated in the signal regeneration stage 200 as logic signals to be converted. Namely, the sensing state 300 does not consume power for the time during which the clock signal CLK is in the logic low (logic 0) state and consumes power, by sensing the input signals transferred from the signal regeneration stage 200 as logic signals, only for the short time during which the clock signal CLK is in the logic high (logic 1) state. Therefore, power consumption even in the sensing stage 300 can be significantly reduced.

Consequently, since the low power consumption low kick-back noise comparator circuit for an analog-to-digital converter in accordance with the embodiment of the present invention only consumes the DC power supplied by the bias voltage BIAS in the input stage 100 and the small amount of AC power used in the signal regeneration stage 200 and the sensing stage 300, the consumption of the DC power in the input stage 100 occupies a large portion in the power consumption of the entire comparator circuit.

Thus, the power consumption of the entire comparator circuit can be reduced when the power consumption in the input stage 100 is reduced. In this regard, since the input stage 100 comprises the simple type of differential signal amplifier and the amount of power consumed by the input stage 100 can be easily reduced by lowering the bias voltage BIAS, the power consumption of the entire comparator circuit can be reduced by reducing the power consumption in the input stage 100 without using an additional device or an additional method.

Figure 4:
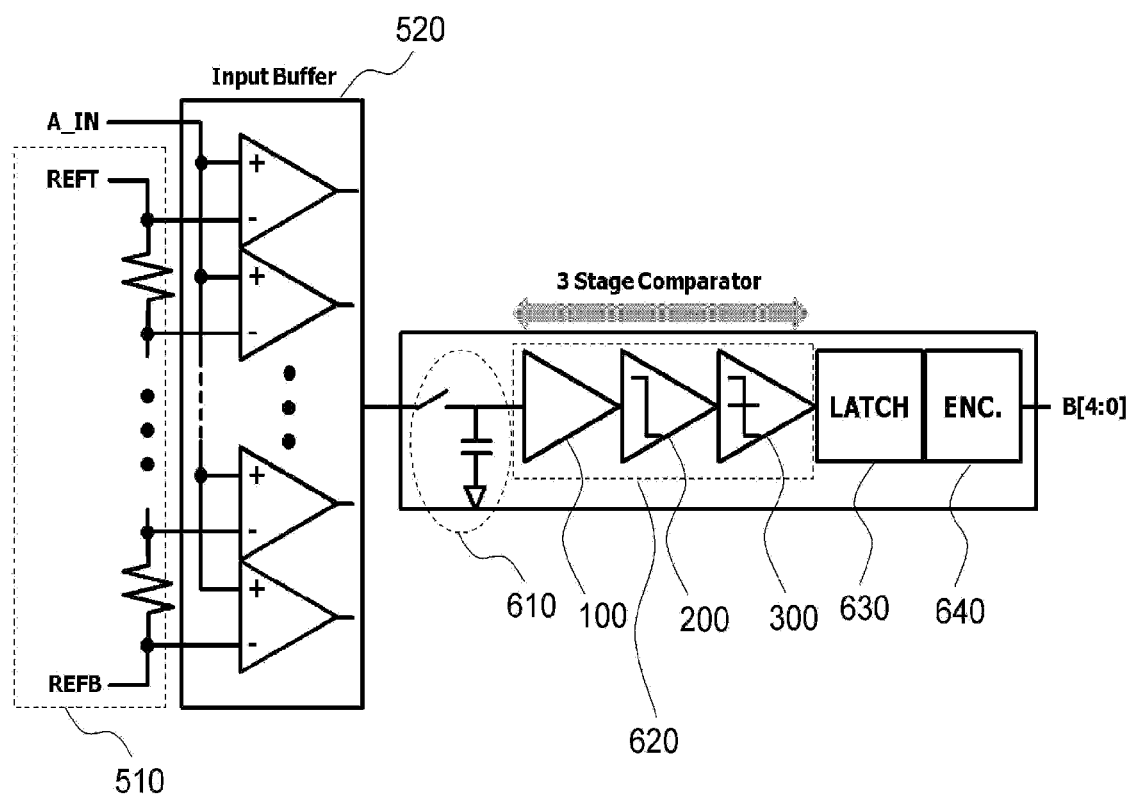
FIG. 4 is a configurational view of an analog-to-digital converter using the low power consumption low kick-back noise comparator circuit according to the present invention.

FIG. 4 is a configurational view of an analog-to-digital converter using the low power consumption low kick-back noise comparator circuit according to the present invention.

Referring to FIG. 4, an analog-to-digital converter using the low power consumption low kick-back noise comparator circuit according to the present invention includes a reference voltage generator 510 composed of a resistor string for dividing reference voltages REFT and REFB applied to both ends thereof into fine voltages through a number of steps, an input buffer 520 configured to buffer an externally applied input analog signal A_IN to be converted and the outputs of the reference voltage generator 510, which are received as a positive (+) input and negative (−) inputs, a track and hold unit 610 connected to the output terminal of the input buffer 520 and composed of a switch and a capacitor for controlling the sampling and outputting of the buffered signals to a comparator circuit 620, the comparator circuit 620 having a three-staged structure and configured to convert the signals sampled and outputted by the track and hold unit 610 into digital signals, and a latch 630 and a digital encoder 640 configured to finally convert the digital signals outputted from the comparator circuit 620 and output converted digital outputs B[4:0] as output signals.

In the analog-to-digital converter configured as mentioned above, the reference voltage generator 510 and the input buffer 520 compare and amplify the input analog signal A_IN and the reference voltages REFT and REFB, and generate 31 analog signals. While it is exemplified in FIG. 4 that 5-bit digital outputs B[4:0] are generated and thus 31 analog signals are generated, it is to be noted that the number of analog signals may be changed depending upon the bit number of digital signals to be finally generated.

The analog signals generated as described above are sampled and outputted by the track and hold unit 610 which is connected to the output terminal of the input buffer 520. The sampled signals are converted into digital signals in the comparator circuit 620 which has the three-staged structure including the input stage 100, the signal regeneration stage 200 and the sensing stage 300, and the 31 digital signals converted in the comparator circuit 620 are transferred to the digital encoder 640 through the latch 630. As in the conventional art, the digital encoder 640 receives the output of the latch 630, converts the output into 5-bit binary codes, and finally output the converted 5-bit binary codes.

Figure 5:
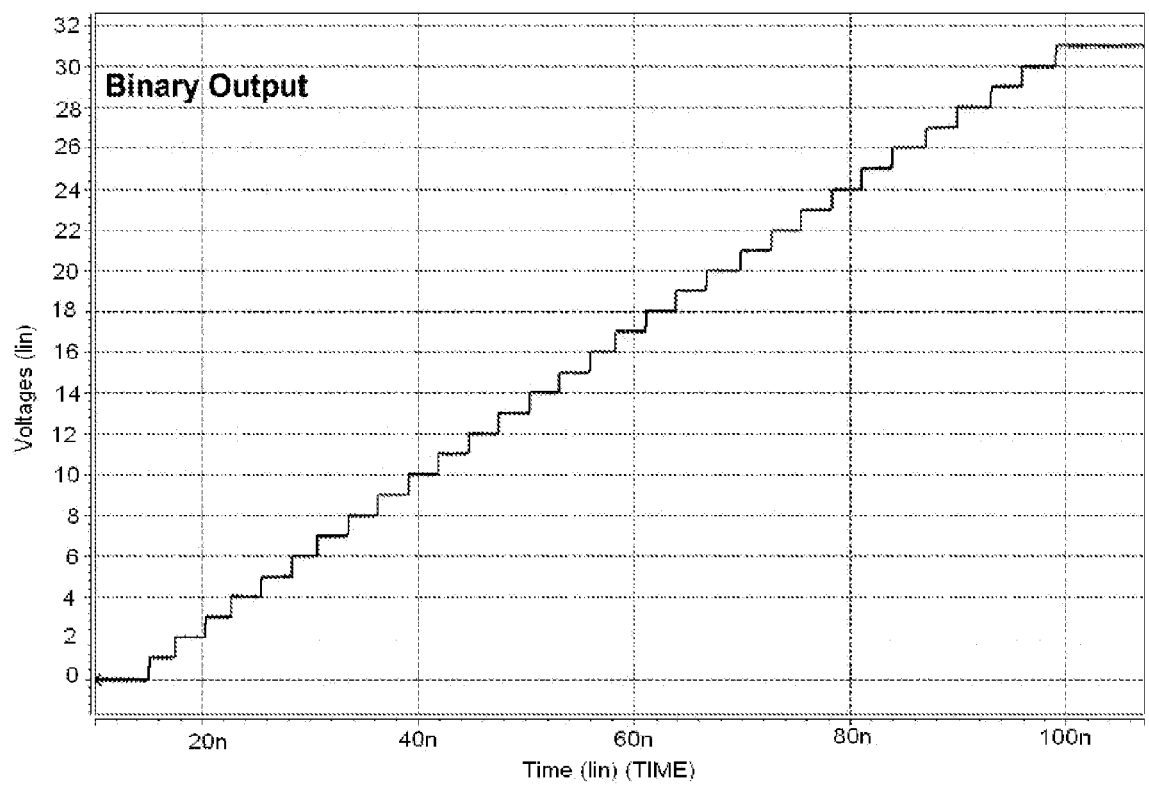
FIG. 5 is a graph showing results of a simulation conducted using the analog-to-digital converter shown in FIG. 4.

FIG. 5 is a graph showing results of a simulation conducted using the analog-to-digital converter shown in FIG. 4. Referring to FIG. 5, by conducting a simulation using linearly increasing analog input signals, it was found that kick-back noise is reduced and digital output signals linearly increase in correspondence to the analog signals even at a low voltage condition, whereby it can be appreciated that the analog-to-digital converter normally operates.

As is apparent from the above description, the low power consumption low kick-back noise comparator circuit for an analog-to-digital converter according to the present invention provides advantages in that, since the comparator circuit is composed of an input stage, a signal regeneration stage and a sensing stage and the input stage has a signal amplifying function, the same amplification performance can be accomplished without using a pre-amplification stage.

Also, in the present invention, due to the fact that the signal regeneration stage is activated only while a clock signal as a control signal is in a logic high state and the sensing stage is activated only while a complementary clock signal is in a logic high stage, power consumption can be reduced. Also, due to the fact that the input stage and the signal regeneration stage are indirectly connected by means of a current mirror structure, kick-back noise introduced from signal regeneration nodes to the input stage can be significantly reduced.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A comparator circuit for an analog-to-digital converter, comprising:
   an input stage including a pair of differential input sections having input transistors to gate terminals of which differential input signals are applied and a bias transistor to a gate terminal of which a bias voltage is applied, and PMOS diode loads configured to indirectly transfer the differential input signals to a signal regeneration stage;
   the signal regeneration stage including PMOS current sources connected to the PMOS diode loads and configured to form current mirrors, a signal regeneration circuit having one terminals which are connected to the PMOS current sources and constituted by connecting inputs and outputs of two inverters with each other, and two NMOS switches having one terminals which are connected to the signal regeneration circuit and the other terminals which are connected to a ground source; and
   a sensing stage including an input section configured to receive output signals of first and second signal regeneration nodes as outputs of the signal regeneration stage, and first and second transmission gates configured to sense the signals applied to the input section, generate logic signals and transfer the generated logic signals to a latch.

2. The comparator circuit according to claim 1,
   wherein the input transistors comprise first and second input transistors having one terminals which are respectively connected to one terminals of the PMOS diode loads and the other terminals which are commonly connected with each other and are connected to one terminal of the bias transistor, and
   wherein the PMOS diode loads comprise first and second PMOS transistors having one terminals which are connected to gate terminals of the first and second PMOS transistors and are connected to the one terminals of the first and second input transistors, the other terminals which are connected to a power supply source, and the gate terminals which are respectively connected to gate terminals of PMOS current sources of the signal regeneration stage and constitute current mirrors.

3. The comparator circuit according to claim 2, wherein the PMOS current sources comprise:
   a first PMOS current source having a gate terminal which is connected to the gate terminal of the second PMOS transistor, one terminal which is connected to one terminal of a first regeneration transistor constituting the signal regeneration circuit, and the other terminal which is connected to the power supply source; and
   a second PMOS current source having a gate terminal which is connected to the gate terminal of the first PMOS transistor, one terminal which is connected to one terminal of a second regeneration transistor constituting the signal regeneration circuit, and the other terminal which is connected to the power supply source.

4. The comparator circuit according to claim 3, wherein the signal regeneration circuit comprises:
   a regeneration control transistor having a gate terminal to which a complementary clock signal as a control signal for controlling a regenerating operation is applied and one and the other terminals which are connected to regeneration transistors; and
   the regeneration transistors configured to regenerate the input signals transferred through the first and second PMOS transistors and output the regenerated signals as output values of the signal regeneration nodes.

5. The comparator circuit according to claim 4,
   wherein the signal regeneration stage is configured to consume power by being activated only for a time during which the complementary clock signal is in a logic high state, and regenerate the input signals.

6. The comparator circuit according to claim 5,
   wherein the input section has gate terminals to which the output values of the first and second signal regeneration nodes are respectively inputted, one terminals which are connected to the first and second transmission gates through transistors, and the other terminals which are connected to the ground source through transistors controlled by a clock signal as a control signal,
   wherein the first transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch, and
   wherein the second transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch.

7. The comparator circuit according to claim 6,
wherein the sensing stage is configured to consume power by being activated only for a time during which the clock signal as the control signal is in a logic high state, sense signals transmitted from the signal regeneration stage, and convert the signals into logic signals.

8. The comparator circuit according to claim 4, wherein the regeneration transistors comprise:
a first regeneration transistor having one terminal which is connected to the one terminal of the first PMOS current source and the other terminal which is connected to a first signal regeneration node;
a second regeneration transistor having one terminal which is connected to the one terminal of the second PMOS current source and the other terminal which is connected to a second signal regeneration node;
a third regeneration transistor having one terminal which is connected to the first signal regeneration node and the other terminal which is connected to a first NMOS switch; and
a fourth regeneration transistor having one terminal which is connected to the second signal regeneration node and the other terminal which is connected to a second NMOS switch.

9. The comparator circuit according to claim 8,
wherein the one terminal of the regeneration control transistor is commonly connected to gate terminals of the first and third regeneration transistors, and the other terminal of the regeneration control transistor is commonly connected to gate terminals of the second and fourth regeneration transistors, and
wherein the gate terminal of the first regeneration transistor is connected to the second signal regeneration node on the one terminal of the second regeneration transistor, and the gate terminal of the second regeneration transistor is connected to the first signal regeneration node on the one terminal of the first regeneration transistor.

10. The comparator circuit according to claim 9,
wherein the signal regeneration stage is configured to consume power by being activated only for a time during which the complementary clock signal is in a logic high state, and regenerate the input signals.

11. The comparator circuit according to claim 10,
wherein the input section has gate terminals to which the output values of the first and second signal regeneration nodes are respectively inputted, one terminals which are connected to the first and second transmission gates through transistors, and the other terminals which are connected to the ground source through transistors controlled by a clock signal as a control signal,
wherein the first transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch, and
wherein the second transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch.

12. The comparator circuit according to claim 11,
wherein the sensing stage is configured to consume power by being activated only for a time during which the clock signal as the control signal is in a logic high state, sense signals transmitted from the signal regeneration stage, and convert the signals into logic signals.

13. The comparator circuit according to claim 8,
wherein the NMOS switches comprise:
the first NMOS switch having one terminal which is connected to the other terminal of the third regeneration transistor and the other terminal which is connected to the ground source; and
the second NMOS switch having one terminal which is connected to the other terminal of the fourth regeneration transistor and the other terminal which is connected to the ground source, and
wherein gate terminals of the first and second NMOS switches are connected with each other and are configured to be applied with the complementary clock signal as the control signal and be controlled in the operations thereof.

14. The comparator circuit according to claim 13,
wherein the signal regeneration stage is configured to consume power by being activated only for a time during which the complementary clock signal is in a logic high state, and regenerate the input signals.

15. The comparator circuit according to claim 14,
wherein the input section has gate terminals to which the output values of the first and second signal regeneration nodes are respectively inputted, one terminals which are connected to the first and second transmission gates through transistors, and the other terminals which are connected to the ground source through transistors controlled by a clock signal as a control signal,
wherein the first transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch, and
wherein the second transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch.

16. The comparator circuit according to claim 15,
wherein the sensing stage is configured to consume power by being activated only for a time during which the clock signal as the control signal is in a logic high state, sense signals transmitted from the signal regeneration stage, and convert the signals into logic signals.

17. The comparator circuit according to claim 8,
wherein the signal regeneration stage is configured to consume power by being activated only for a time during which the complementary clock signal is in a logic high state, and regenerate the input signals.

18. The comparator circuit according to claim 17,
wherein the input section has gate terminals to which the output values of the first and second signal regeneration nodes are respectively inputted, one terminals which are connected to the first and second transmission gates through transistors, and the other terminals which are connected to the ground source through transistors controlled by a clock signal as a control signal,
wherein the first transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch, and
wherein the second transmission gate is composed of two transistors having gate terminals to which the clock signal as the control signal is applied, one terminals which are connected with each other and the other terminals which are connected to the power supply source, and is configured to transmit an output signal where the one terminals of the two transistors are connected with each other, to the latch.

19. The comparator circuit according to claim 18,
wherein the sensing stage is configured to consume power by being activated only for a time during which the clock signal as the control signal is in a logic high state, sense signals transmitted from the signal regeneration stage, and convert the signals into logic signals.

* * * * *